United States Patent
Harada et al.

(10) Patent No.: US 11,393,972 B2
(45) Date of Patent: Jul. 19, 2022

(54) MULTI-LAYER PIEZOELECTRIC CERAMIC COMPONENT AND PIEZOELECTRIC DEVICE

(71) Applicant: TAIYO YUDEN CO., LTD., Tokyo (JP)

(72) Inventors: Tomohiro Harada, Takasaki (JP); Takayuki Goto, Takasaki (JP); Hiroyuki Shimizu, Takasaki (JP); Sumiaki Kishimoto, Takasaki (JP)

(73) Assignee: TAIYO YUDEN CO., LTD, Tokyo (JP)

( * ) Notice: Subject to any disclaimer, the term of this patent is extended or adjusted under 35 U.S.C. 154(b) by 774 days.

(21) Appl. No.: 16/258,359

(22) Filed: Jan. 25, 2019

(65) Prior Publication Data
US 2019/0237652 A1    Aug. 1, 2019

(30) Foreign Application Priority Data
Jan. 30, 2018 (JP) .............................. JP2018-013960

(51) Int. Cl.
*H01L 41/083* (2006.01)
*H01L 41/047* (2006.01)
*H01L 41/09* (2006.01)

(52) U.S. Cl.
CPC ........ *H01L 41/083* (2013.01); *H01L 41/0471* (2013.01); *H01L 41/0477* (2013.01); *H01L 41/09* (2013.01); *H01L 41/094* (2013.01)

(58) Field of Classification Search
CPC . H01L 41/0471; H01L 41/047; H01L 41/083; H01L 41/09; H01L 41/0477
See application file for complete search history.

(56) References Cited

U.S. PATENT DOCUMENTS 4,805,057 A * 2/1989 Ogawa .................. H01L 41/083
                                                    310/332
9,219,222 B2 * 12/2015 Iwasaki ................ H01L 41/053
(Continued)

FOREIGN PATENT DOCUMENTS

JP          S6146082 A       3/1986
JP          S62250681 A     10/1987
(Continued)

OTHER PUBLICATIONS

Machine Translation of JP-H11-277745A cited in the office action dated Dec. 15, 2021. (21 pages).
(Continued)

*Primary Examiner* — J. San Martin
(74) *Attorney, Agent, or Firm* — Law Office of Katsuhiro Arai

(57) ABSTRACT

A multi-layer piezoelectric ceramic component includes: a piezoelectric ceramic body having a cuboid shape, having upper and lower surfaces facing in a thickness direction, first and second end surfaces facing in a length direction, and a pair of side surfaces facing in a width direction, and including first and second regions; first internal electrodes in the first region; second internal electrodes in the second region; third internal electrodes in the first and second regions; a first terminal electrode formed on the first end surface and electrically connected to the first internal electrodes; a second terminal electrode formed on the first end surface and electrically connected to the second internal electrodes; a third terminal electrode formed on the second end surface and electrically connected to the third internal electrodes; a first surface electrode formed on the upper surface; and a second surface electrode formed on the lower surface.

4 Claims, 14 Drawing Sheets

(56) References Cited

U.S. PATENT DOCUMENTS

| | | |
|---|---|---|
| 2013/0241352 A1 | 9/2013 | Hayashi et al. |
| 2014/0146436 A1* | 5/2014 | Kim .................. H01G 4/30 |
| | | 361/301.4 |
| 2016/0337760 A1 | 11/2016 | Suenaga |
| 2017/0076870 A1* | 3/2017 | Noda .................. H01G 4/232 |
| 2019/0237653 A1* | 8/2019 | Kishimoto .......... H01L 41/0471 |
| 2019/0237656 A1* | 8/2019 | Goto .................. H01L 41/338 |

FOREIGN PATENT DOCUMENTS

| | | | |
|---|---|---|---|
| JP | H09289342 A | | 11/1997 |
| JP | 11277745 A | * | 10/1999 |
| NO | 2015114849 A1 | | 8/2015 |
| WO | 2013051328 A1 | | 4/2013 |

OTHER PUBLICATIONS

A Notice of Reasons for Refusal issued by the Japanese Patent Office, dated Mar. 4, 2021, for Japanese counterpart application No. 2018-013960. (4 pages).

\* cited by examiner

MULTI-LAYER PIEZOELECTRIC CERAMIC COMPONENT AND PIEZOELECTRIC DEVICE

CROSS REFERENCE TO RELATED APPLICATIONS

This application claims the benefit of Japanese Priority Patent Application JP 2018-013960 filed Jan. 30, 2018, the entire contents of which are incorporated herein by reference.

BACKGROUND

The present disclosure relates to a multi-layer piezoelectric ceramic component usable as a piezoelectric actuator and to a piezoelectric device.

A piezoelectric actuator is an actuator that includes a piezoelectric element including a piezoelectric material and an electrode and uses deformation that is caused in the piezoelectric material by an inverse piezoelectric effect when a voltage is applied to the electrode. The piezoelectric actuator includes a bimorph piezoelectric actuator that includes two piezoelectric actuators.

A general bimorph piezoelectric actuator has a structure in which the piezoelectric actuators are attached to both surfaces of a metal plate, and one of the piezoelectric actuators is expanded and the other one of the piezoelectric actuators is contracted, to enable the whole of the actuator to be largely deformed. Further, in the bimorph piezoelectric actuator, a piezoelectric actuator having an element bimorph structure in which two piezoelectric actuators are integrated, i.e., an element bimorph actuator, is provided (for example, WO 2013/051328).

For such a piezoelectric actuator, a technique of suppressing a breakdown due to bending caused by large displacement is also proposed (for example, Japanese Patent Application Laid-open No. Hei 09-289342). For example, in this technique, the piezoelectric material is made thick in the vicinity of the center of the piezoelectric actuator and is made thinner toward the outside thereof, to provide selectivity to the electric field strength in the piezoelectric actuator.

SUMMARY

However, in the technique disclosed in Japanese Patent Application Laid-open No. Hei 09-289342, when the layer thickness is changed in a single element, a forming machine including a specific number of rolls is to be used because several types of green sheets having different layer thicknesses are used to obtain a laminate. For that reason, a lead time at the time of manufacturing is elongated, which causes increase in cost. Further, when the element bimorph actuator is used with one end thereof being fixed with a fixing jig, a load associated with bending may increase in the vicinity of the fixing jig, and a mechanical breakdown of the element may be caused in the vicinity of the fixing jig.

In view of the circumstances as described above, it is desirable to provide a multi-layer piezoelectric ceramic component and a piezoelectric device, in which increase in cost is suppressed and mechanical reliability is improved.

According to an embodiment of the present disclosure, there is provided a multi-layer piezoelectric ceramic component including a piezoelectric ceramic body, first internal electrodes, second internal electrodes, third internal electrodes, a first terminal electrode, a second terminal electrode, a third terminal electrode, a first surface electrode, and a second surface electrode.

The piezoelectric ceramic body has a cuboid shape in which a length is larger than a width and the width is larger than a thickness, has an upper surface and a lower surface facing each other in a thickness direction, a first end surface and a second end surface facing each other in a length direction, and a pair of side surfaces facing each other in a width direction, and includes a first region on a side of the upper surface in the thickness direction and a second region on a side of the lower surface in the thickness direction.

The first internal electrodes are formed in the first region and are drawn to the first end surface.

The second internal electrodes are formed in the second region and are drawn to the first end surface.

The third internal electrodes are formed in the first region and the second region and are drawn to the second end surface, the third internal electrodes being laminated alternately with the first internal electrodes in the first region at predetermined distances from the respective first internal electrodes in the thickness direction and being laminated alternately with the second internal electrodes in the second region at predetermined distances from the respective second internal electrodes in the thickness direction.

The first terminal electrode is formed on the first end surface and is electrically connected to the first internal electrodes.

The second terminal electrode is formed on the first end surface, is electrically insulated from the first terminal electrode, and is electrically connected to the second internal electrodes.

The third terminal electrode is formed on the second end surface and is electrically connected to the third internal electrodes.

The first surface electrode is formed on the upper surface, is electrically connected to the third terminal electrode, and extends from the second end surface to face one of the first internal electrodes.

The second surface electrode is formed on the lower surface, is electrically connected to the third terminal electrode, extends from the second end surface to face one of the second internal electrodes, and has a length shorter than a length of the first surface electrode.

With such a configuration, when a voltage is applied between the first internal electrodes and the third internal electrodes, the piezoelectric ceramic body in the first region can be deformed, and when a voltage is applied between the second internal electrodes and the third internal electrodes, the piezoelectric ceramic body in the second region can be deformed. Therefore, the deformation in the first region and the deformation in the second region can be independently controlled. Additionally, in this configuration, the first surface electrode that is formed on the upper surface, is electrically connected to the third terminal electrode, and extends from the second end surface to face one of the first internal electrodes, and the second surface electrode that is formed on the lower surface, is electrically connected to the third terminal electrode, and extends from the second end surface to face one of the second internal electrodes are disposed, and the second surface electrode has a length shorter than a length of the first surface electrode. Thus, when the multi-layer piezoelectric ceramic component is fixed with a fixing jig, stress to be applied to the vicinity of the fixing jig is dispersed, and a breakdown of the element is suppressed.

In the multi-layer piezoelectric ceramic component, the first internal electrodes, the second internal electrodes, and the third internal electrodes may each have a width equal to a distance between the pair of side surfaces.

With such a configuration, the first internal electrodes, the second internal electrodes, and the third internal electrodes each have the width equal to the width of the piezoelectric ceramic body and are exposed at the side surfaces of the piezoelectric ceramic body. When the first internal electrodes, the second internal electrodes, and the third internal electrodes are embedded in the piezoelectric ceramic body and are not exposed at the side surfaces, restraint by the piezoelectric ceramic body (side margins) covering the side surfaces of those internal electrodes suppresses the deformation of the multi-layer piezoelectric ceramic component. However, with the configuration described above, the restraint by the side margins is not caused, which makes it possible to prevent reduction in displacement performance.

In the multi-layer piezoelectric ceramic component, the pair of side surfaces, a part of the upper surface, and a part of the lower surface may be covered with an insulating film made of a material different from a material of the piezoelectric ceramic body, and the insulating film formed on the upper surface may have a length equal to a length of the second surface electrode.

With such a configuration, the first terminal electrode, the second terminal electrode, and the first surface electrode are exposed from the insulating film on the side of the upper surface. This makes it possible to establish electrical connection to three terminals including the first terminal electrode, the second terminal electrode, and the first surface electrode.

According to another embodiment of the present disclosure, there is provided a piezoelectric device including a vibration member, and a multi-layer piezoelectric ceramic component mounted to the vibration member.

The multi-layer piezoelectric ceramic component includes a piezoelectric ceramic body, first internal electrodes, second internal electrodes, third internal electrodes, a first terminal electrode, a second terminal electrode, a third terminal electrode, a first surface electrode, and a second surface electrode.

The piezoelectric ceramic body has a cuboid shape in which a length is larger than a width and the width is larger than a thickness, has an upper surface and a lower surface facing each other in a thickness direction, a first end surface and a second end surface facing each other in a length direction, and a pair of side surfaces facing each other in a width direction, and includes a first region on a side of the upper surface in the thickness direction and a second region on a side of the lower surface in the thickness direction.

The first internal electrodes are formed in the first region and are drawn to the first end surface.

The second internal electrodes are formed in the second region and are drawn to the first end surface.

The third internal electrodes are formed in the first region and the second region and are drawn to the second end surface, the third internal electrodes being laminated alternately with the first internal electrodes in the first region at predetermined distances from the respective first internal electrodes in the thickness direction and being laminated alternately with the second internal electrodes in the second region at predetermined distances from the respective second internal electrodes in the thickness direction.

The first terminal electrode is formed on the first end surface and is electrically connected to the first internal electrodes.

The second terminal electrode is formed on the first end surface, is electrically insulated from the first terminal electrode, and is electrically connected to the second internal electrodes.

The third terminal electrode is formed on the second end surface and is electrically connected to the third internal electrodes.

The first surface electrode is formed on the upper surface, is electrically connected to the third terminal electrode, and extends from the second end surface to face one of the first internal electrodes.

The second surface electrode is formed on the lower surface, is electrically connected to the third terminal electrode, extends from the second end surface to face one of the second internal electrodes, and has a length shorter than a length of the first surface electrode.

With such a configuration, when the multi-layer piezoelectric ceramic component mounted to the vibration member is fixed with a fixing jig, stress applied to the vicinity of the fixing jig is dispersed, and a breakdown of the element is suppressed.

As described above, according to the present disclosure, it is possible to provide a multi-layer piezoelectric ceramic component and a piezoelectric device, in which increase in cost is suppressed and mechanical reliability is improved.

These and other objects, features and advantages of the present disclosure will become more apparent in light of the following detailed description of embodiments thereof, as illustrated in the accompanying drawings.

BRIEF DESCRIPTION OF DRAWINGS

FIG. 3 is a plan view of a first side surface 101a;

DETAILED DESCRIPTION OF EMBODIMENTS

Hereinafter, an embodiment of the present disclosure will be described with reference to the drawings. In each figure, an X-Y-Z coordinate system is used in some cases. A multi-layer piezoelectric ceramic component according to an embodiment of the present disclosure will be described.

Configuration of Multi-Layer Piezoelectric Ceramic Component

Figure 1:
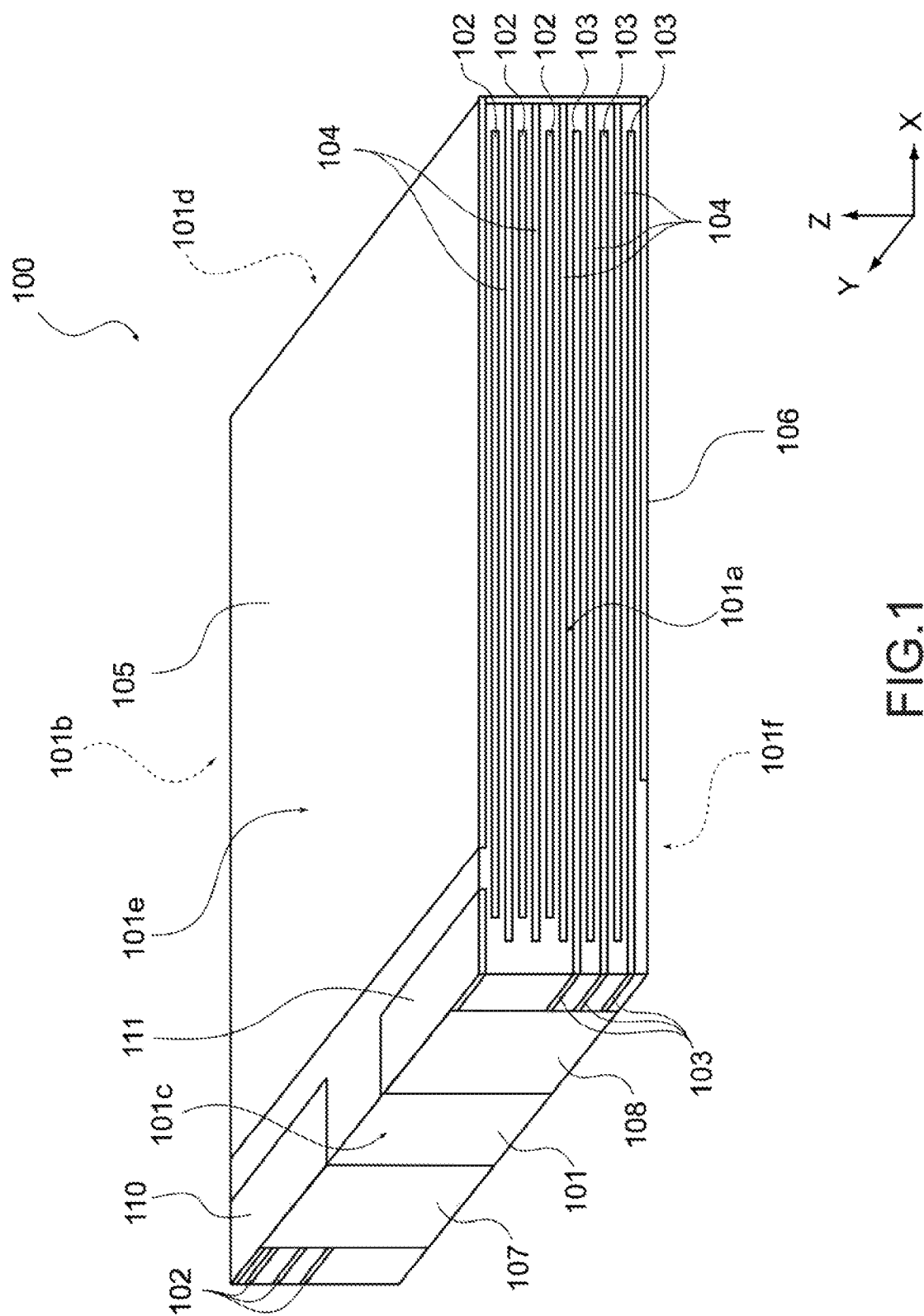
FIG. 1 is a perspective view of a multi-layer piezoelectric ceramic component 100 according to an embodiment.
Figure 2:
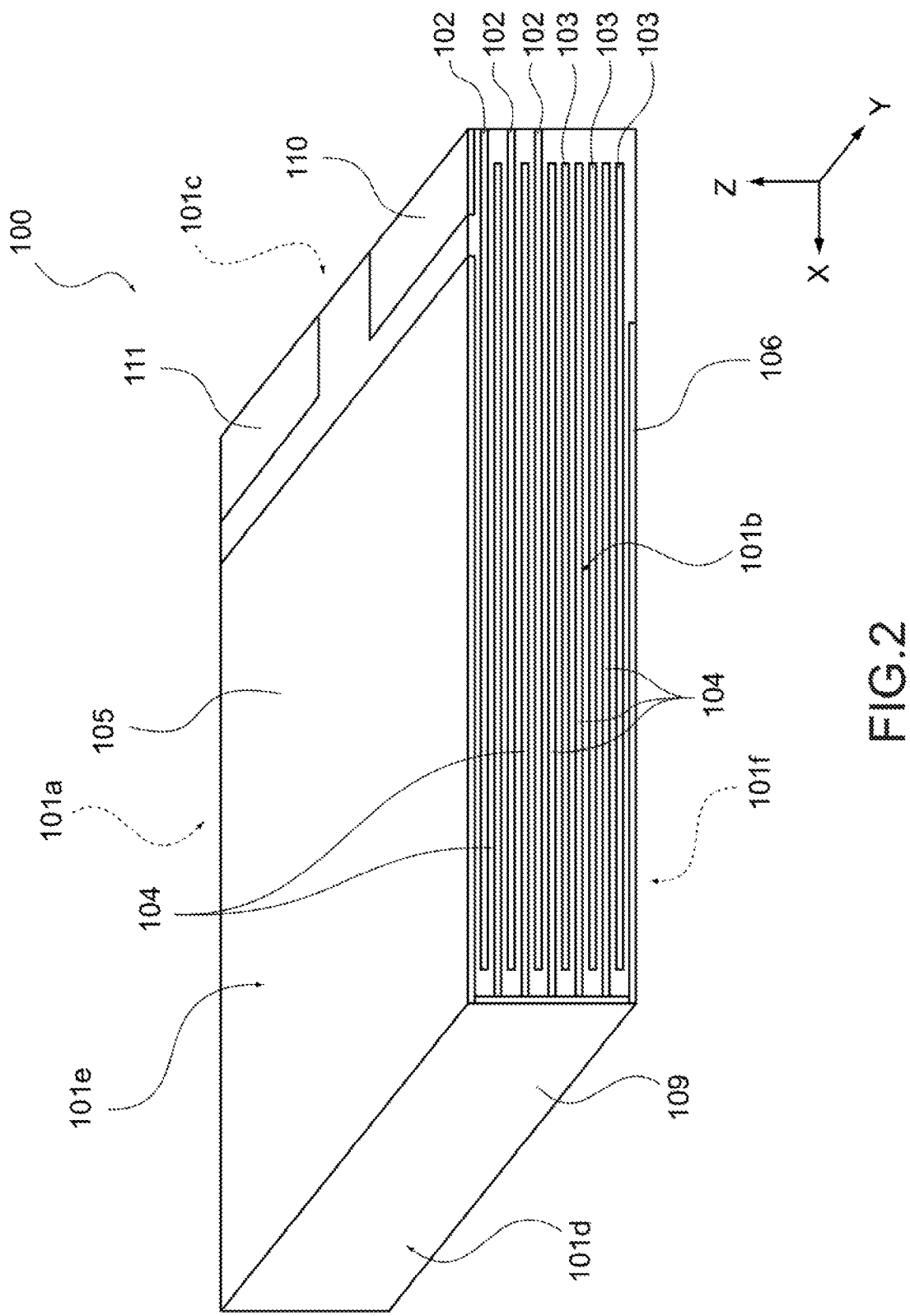
FIG. 2 is a perspective view of the multi-layer piezoelectric ceramic component 100 according to the embodiment.

FIGS. 1 and 2 are each a perspective view of a multi-layer piezoelectric ceramic component 100 according to an embodiment. FIG. 2 is a view of the opposite side from FIG. 1.

As shown in FIGS. 1 and 2, the multi-layer piezoelectric ceramic component 100 includes a piezoelectric ceramic body 101, first internal electrodes 102, second internal electrodes 103, third internal electrodes 104, a first surface electrode 105, a second surface electrode 106, a first end surface terminal electrode 107, a second end surface terminal electrode 108, a third end surface terminal electrode 109, a first surface terminal electrode 110, and a second surface terminal electrode 111.

The piezoelectric ceramic body 101 is made of a piezoelectric ceramic material. The piezoelectric ceramic body 101 includes a plurality of piezoelectric ceramic layers arranged in a Z-axis direction. The plurality of piezoelectric ceramic layers are provided in the Z-axis direction between the first internal electrodes 102 and the third internal electrodes 104 and also between the second internal electrodes 103 and the third internal electrodes 104. In this embodiment, the plurality of piezoelectric ceramic layers are also referred to as the piezoelectric ceramic body 101.

The piezoelectric ceramic body 101 may be made of, for example, lithium niobate ($LiNbO_3$), lithium tantalite ($LiTaO_3$), or lead zirconate titanate ($PbZrO_3$—$PbTiO_3$).

As shown in FIGS. 1 and 2, the piezoelectric ceramic body 101 has a cuboid shape. Assuming that the X-axis direction is a length direction, the Y-axis direction is a width direction, and the Z-axis direction is a thickness direction, the piezoelectric ceramic body 101 has such a shape that the length is larger than the width and the width is larger than the thickness (length>width>thickness).

For the surfaces of the piezoelectric ceramic body 101, surfaces facing in the width direction (Y-axis direction) are assumed as a first side surface 101a and a second side surface 101b, and surfaces facing in the length direction (X-axis direction) are assumed as a first end surface 101c and a second end surface 101d. Further, surfaces facing in the thickness direction (Z-axis direction) are assumed as an upper surface 101e and a lower surface 101f.

Figure 3:
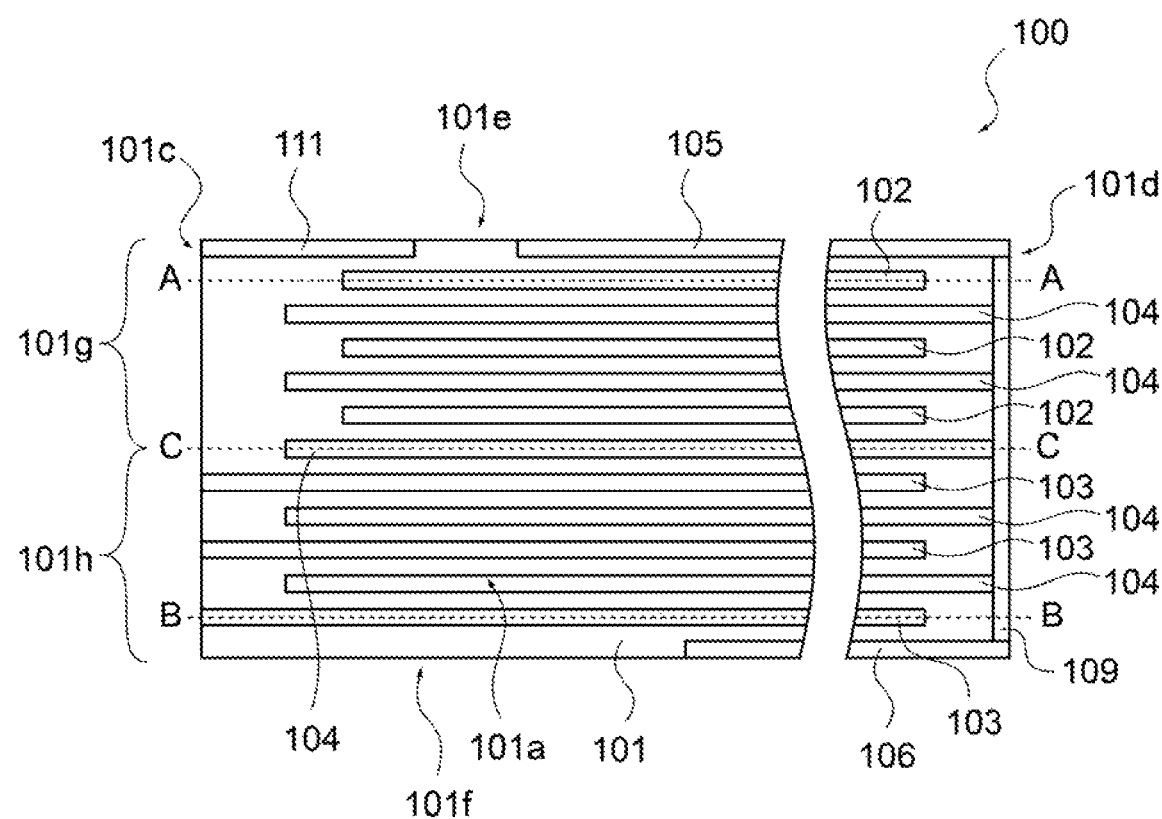
Figure 4:
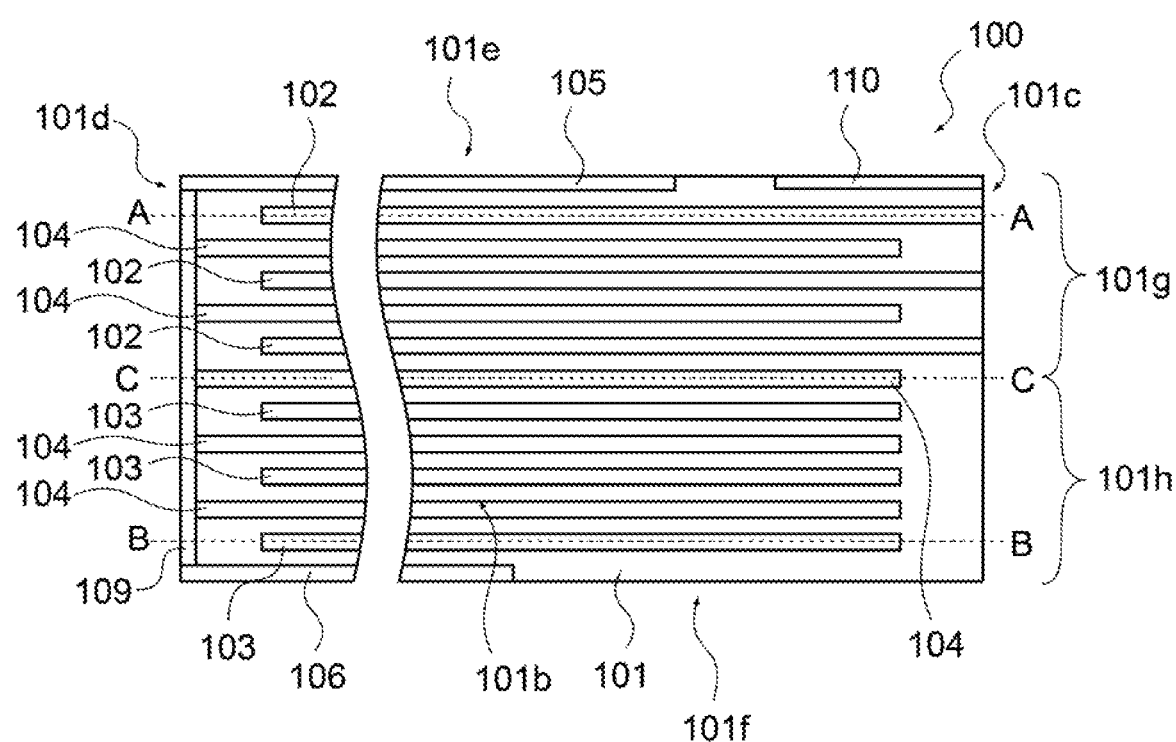
FIG. 4 is a plan view of a second side surface 101b.

FIG. 3 is a plan view of the first side surface 101a. FIG. 4 is a plan view of the second side surface 101b.

Figure 5:
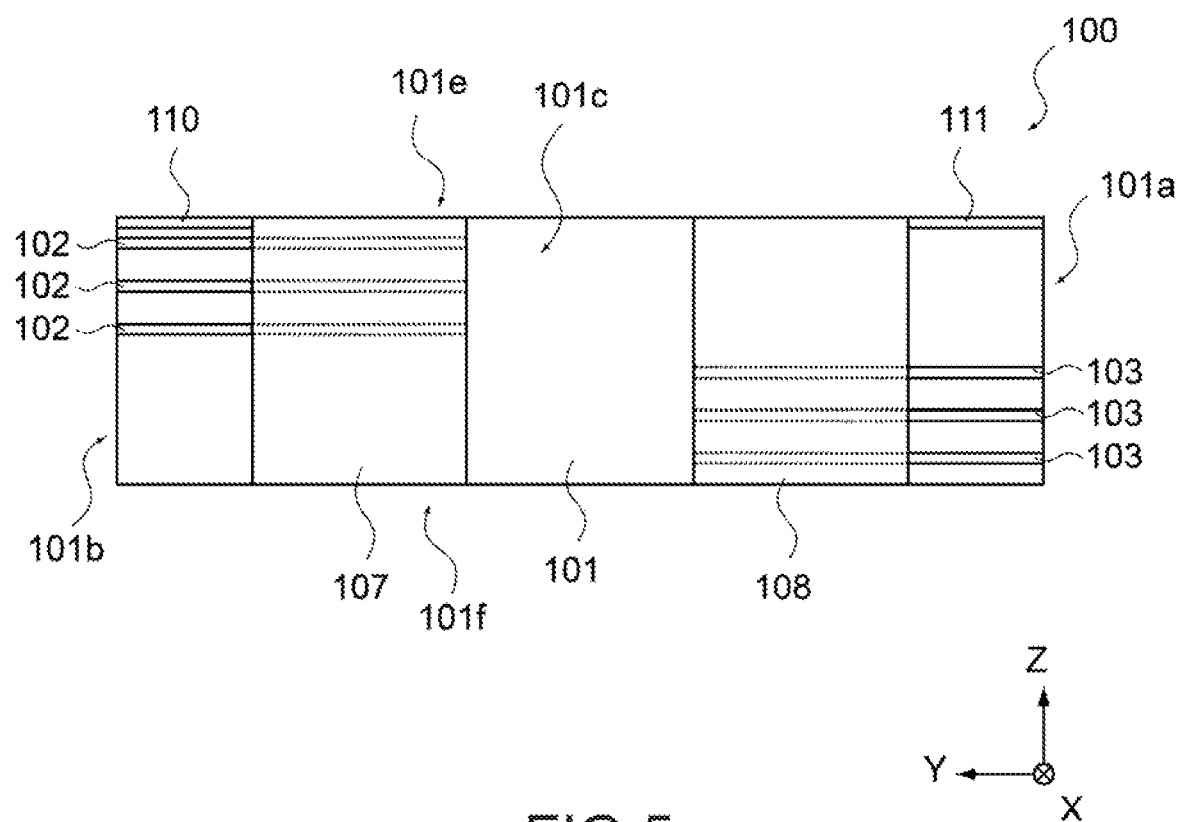
FIG. 5 is a plan view of a first end surface 101c.
Figure 6:
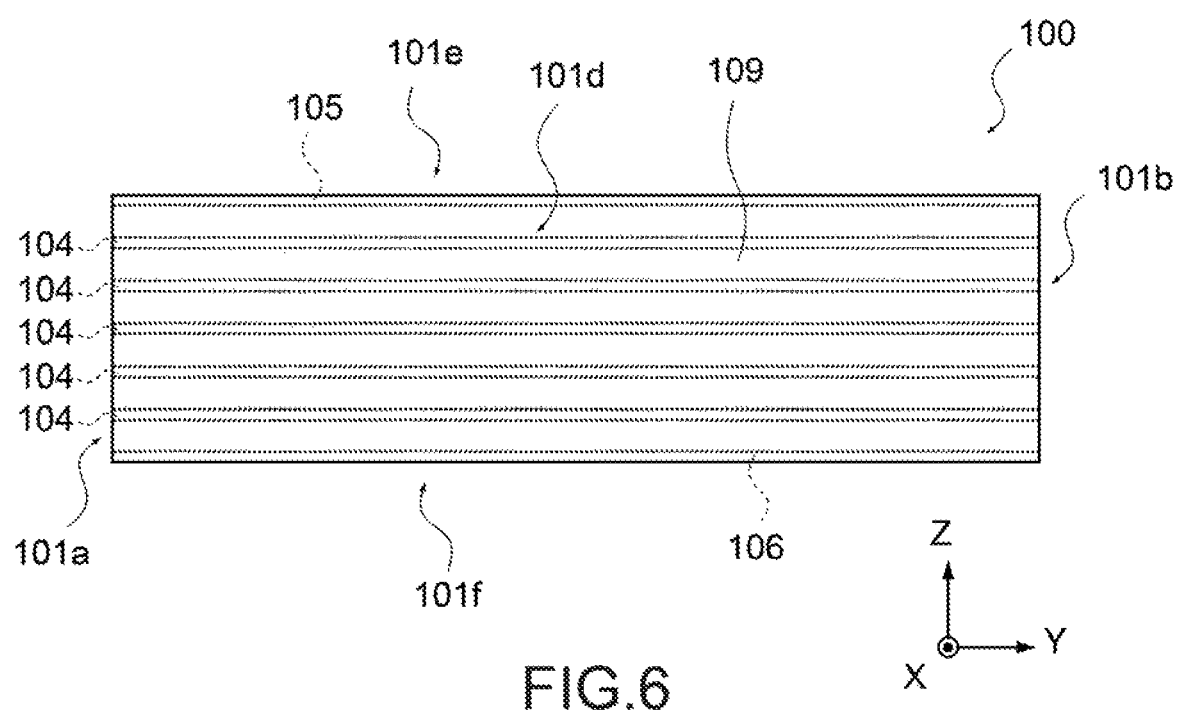
FIG. 6 is a plan view of a second end surface 101d.

FIG. 5 is a plan view of the first end surface 101c. FIG. 6 is a plan view of the second end surface 101d.

Figure 7:
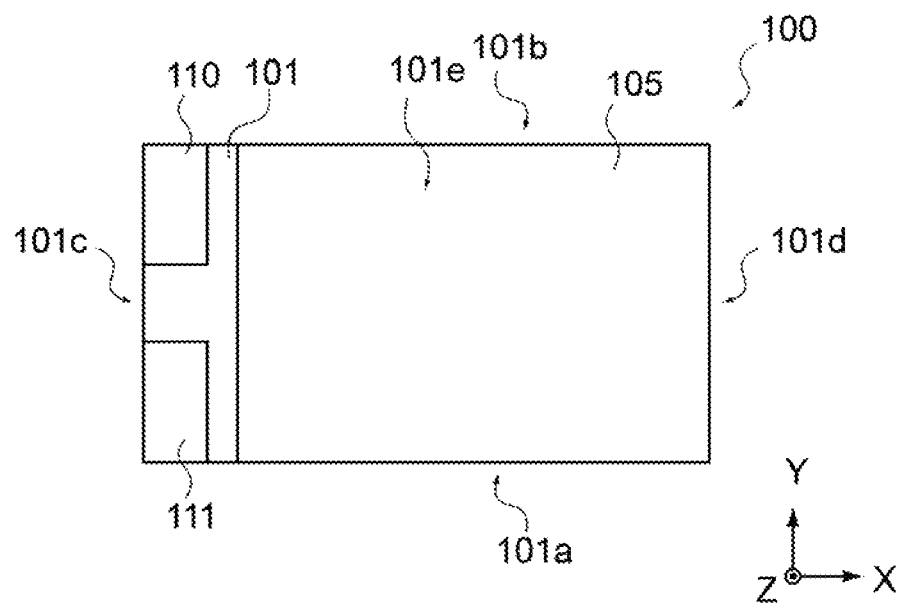
FIG. 7 is a plan view of an upper surface 101e.
Figure 8:
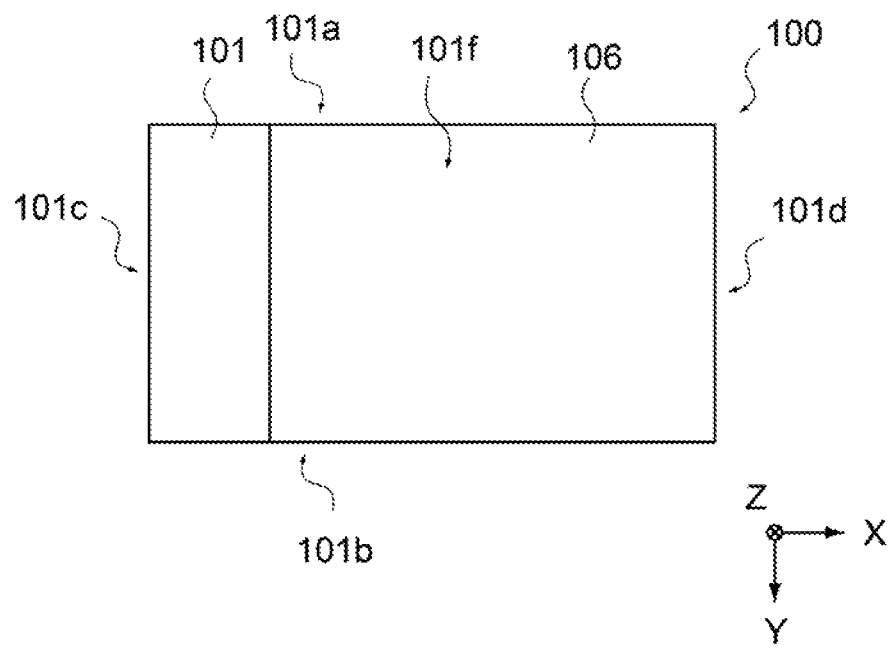
FIG. 8 is a plan view of a lower surface 101f.

FIG. 7 is a plan view of the upper surface 101e. FIG. 8 is a plan view of the lower surface 101f.

As shown in FIGS. 3 and 4, the piezoelectric ceramic body 101 includes a first region 101g on the upper surface 101e side and a second region 101h on the lower surface 101f side, which are divided in the Z-axis direction. The thickness of the first region 101g and the thickness of the second region 101h suitably have a ratio of 1:1.

Figure 9:
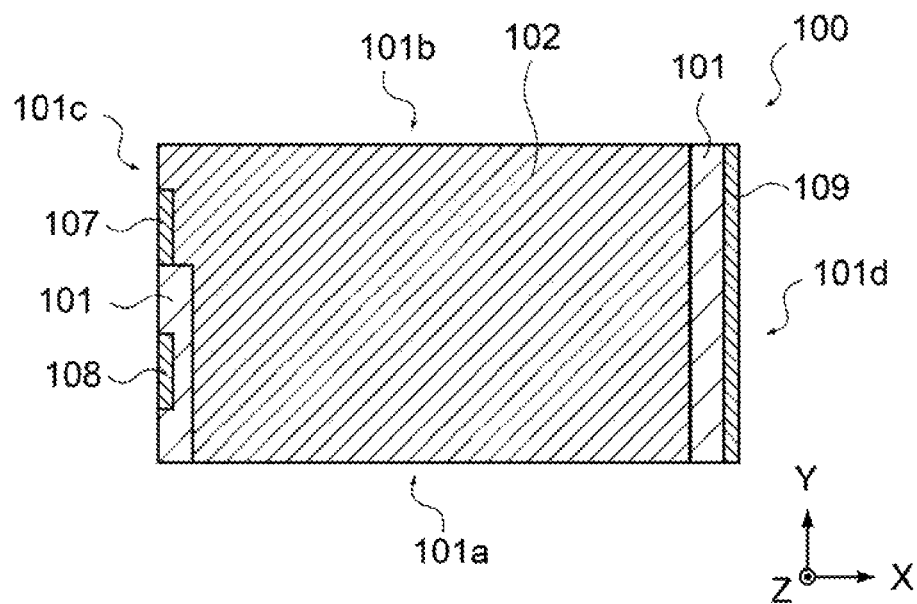
FIG. 9 is a cross-sectional view of the multi-layer piezoelectric ceramic component 100, which shows a first internal electrode 102.

The first internal electrodes 102 are formed in the first region 101g and face the third internal electrodes 104 and the first surface electrode 105 via the piezoelectric ceramic body 101 (see FIGS. 3 and 4). FIG. 9 is a cross-sectional view of the multi-layer piezoelectric ceramic component 100, which shows the first internal electrode 102, and is also a cross-sectional view taken along the line A-A of FIGS. 3 and 4. As shown in FIG. 9, the first internal electrode 102 is drawn to the first end surface 101c, partially exposed at the first end surface 101c, and electrically connected to the first end surface terminal electrode 107.

Further, the first internal electrode 102 has the same width as the width (Y-axis direction) of the piezoelectric ceramic body 101 and is exposed at the first side surface 101a and the second side surface 101b (see FIGS. 3 and 4). The number of first internal electrodes 102 is not particularly limited, and the first internal electrodes 102 may be a single layer or a plurality of layers.

Figure 10:
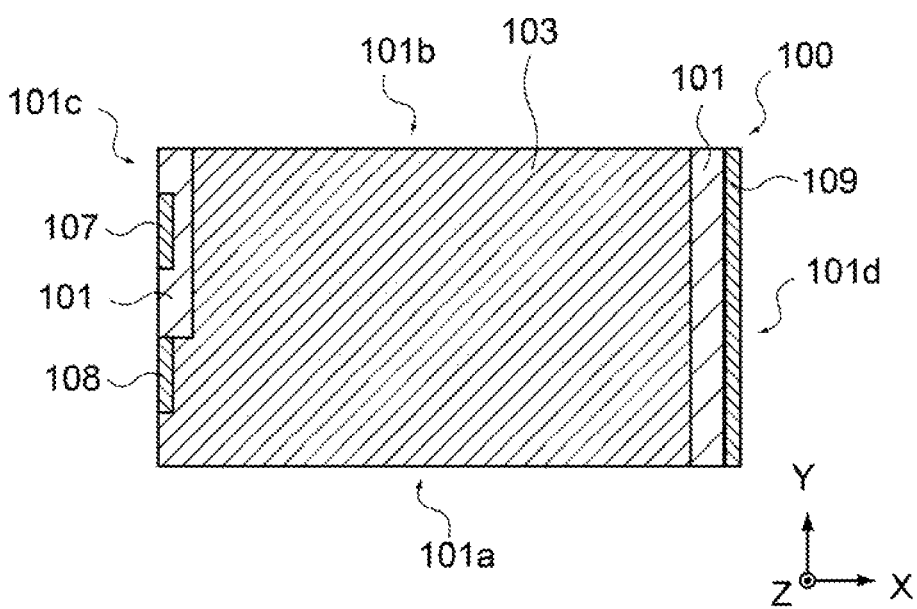
FIG. 10 is a cross-sectional view of the multi-layer piezoelectric ceramic component 100, which shows a second internal electrode 103.

The second internal electrodes 103 are formed in the second region 101h and face the third internal electrodes 104 and the second surface electrode 106 via the piezoelectric ceramic body 101 (see FIGS. 3 and 4). FIG. 10 is a cross-sectional view of the multi-layer piezoelectric ceramic component 100, which shows the second internal electrode 103, and is also a cross-sectional view taken along the line B-B of FIGS. 3 and 4. As shown in FIG. 10, the second internal electrode 103 is drawn to the first end surface 101c, partially exposed at the first end surface 101c, and electrically connected to the second end surface terminal electrode 108.

Further, the second internal electrode 103 has the same width as the width (Y-axis direction) of the piezoelectric ceramic body 101 and is exposed at the first side surface 101a and the second side surface 101b (see FIGS. 3 and 4). The number of second internal electrodes 103 is not particularly limited, and the second internal electrodes 103 may be a single layer or a plurality of layers.

The third internal electrodes 104 are formed in the first region 101g and the second region 101h.

The third internal electrodes 104 are laminated alternately with the first internal electrodes 102 in the first region 101g at predetermined distances from the respective first internal electrodes 102 in the thickness direction (Z-axis direction) and face the respective first internal electrodes 102 via the piezoelectric ceramic body 101 (see FIGS. 3 and 4).

Further, the third internal electrodes 104 are laminated alternately with the second internal electrodes 103 in the second region 101h at predetermined distances from the respective second internal electrodes 103 in the thickness direction (Z-axis direction) and face the respective second internal electrodes 103 via the piezoelectric ceramic body 101 (see FIGS. 3 and 4).

Figure 11:
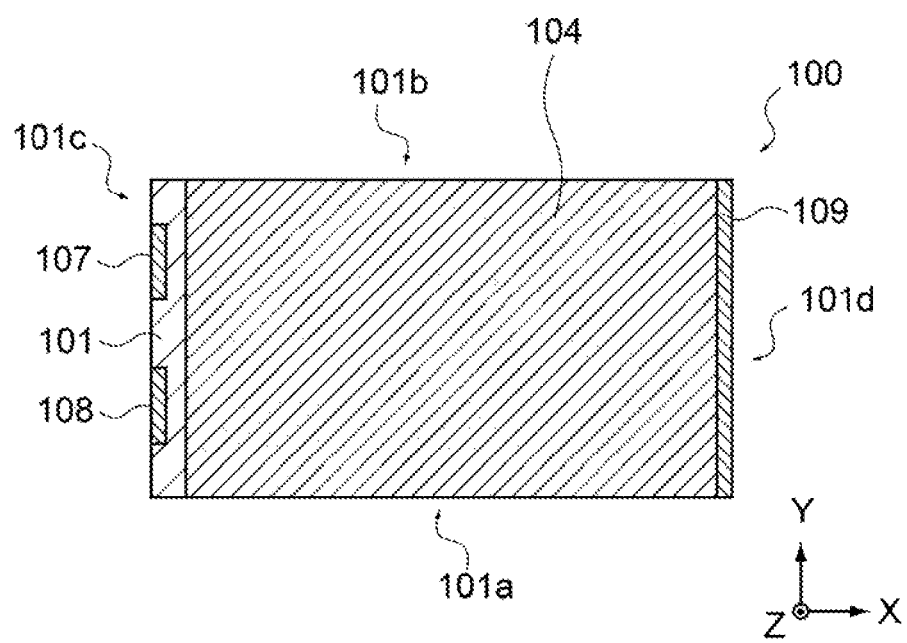
FIG. 11 is a cross-sectional view of the multi-layer piezoelectric ceramic component 100, which shows a third internal electrode 104.

FIG. 11 is a cross-sectional view of the multi-layer piezoelectric ceramic component 100, which shows the third internal electrode 104, and is also a cross-sectional view taken along the line C-C of FIGS. 3 and 4. As shown in FIG. 11, the third internal electrode 104 is drawn to the second end surface 101d, exposed at the second end surface 101d, and electrically connected to the third end surface terminal electrode 109.

Further, the third internal electrode 104 has the same width as the width (Y-axis direction) of the piezoelectric ceramic body 101 and is exposed at the first side surface 101a and the second side surface 101b (see FIGS. 3 and 4). The number of third internal electrodes 104 may be set to correspond to the number of first internal electrodes 102 and the number of second internal electrodes 103.

The first surface electrode 105 extends from the second end surface 101d side to be formed on the upper surface 101e (see FIG. 1) and is electrically connected to the third end surface terminal electrode 109. The first surface electrode 105 faces one of the first internal electrodes 102 in the Z-axis direction via the piezoelectric ceramic body 101. Further, the first surface electrode 105 is apart from and electrically insulated from the first surface terminal electrode 110 and the second surface terminal electrode 111 on the upper surface 101e (see FIG. 7).

The second surface electrode 106 extends from the second end surface 101d side to be formed on the lower surface 101f and is electrically connected to the third end surface terminal electrode 109 (see FIG. 2). The second surface electrode 106 faces one of the second internal electrodes 103 in the Z-axis direction via the piezoelectric ceramic body 101. However, in the X-axis direction, the length of the second surface electrode 106 is shorter than the length of the first surface electrode 105.

The first end surface terminal electrode 107 is formed on the first end surface 101c (see FIG. 1) and is electrically connected to the first internal electrodes 102. Further, the first end surface terminal electrode 107 is electrically insulated from the second internal electrodes 103 and the second end surface terminal electrode 108. The first end surface terminal electrode 107 is formed between the upper surface 101e and the lower surface 101f on the first end surface 101c and is electrically connected to the first surface terminal electrode 110.

The second end surface terminal electrode 108 is formed on the first end surface 101c (see FIG. 1) and is electrically connected to the second internal electrodes 103. Further, the second end surface terminal electrode 108 is electrically insulated from the first internal electrodes 102 and the first end surface terminal electrode 107. The second end surface terminal electrode 108 is formed between the upper surface 101e and the lower surface 101f on the first end surface 101c and is electrically connected to the second surface terminal electrode 111.

The third end surface terminal electrode 109 is formed on the second end surface 101d (see FIG. 2) and is electrically connected to the third internal electrodes 104. Further, the third end surface terminal electrode 109 is formed between the upper surface 101e and the lower surface 101f on the second end surface 101d and is electrically connected to the first surface electrode 105 and the second surface electrode 106.

The first surface terminal electrode 110 is formed on the upper surface 101e (see FIG. 1). The first surface terminal electrode 110 is electrically connected to the first end surface terminal electrode 107 and is electrically insulated from the second surface terminal electrode 111 and the first surface electrode 105.

The second surface terminal electrode 111 is formed on the upper surface 101e (see FIG. 1). The second surface terminal electrode 111 is electrically connected to the second end surface terminal electrode 108 and is electrically insulated from the first surface terminal electrode 110 and the first surface electrode 105.

The first internal electrodes 102, the second internal electrodes 103, the third internal electrodes 104, the first surface electrode 105, the second surface electrode 106, the first end surface terminal electrode 107, the second end surface terminal electrode 108, the third end surface terminal electrode 109, the first surface terminal electrode 110, and the second surface terminal electrode 111 are each made of an electrically conductive material. The electrically conductive material may be any one of, for example, Ag, Ag/Pd, Pd, Cu, and Ni.

The multi-layer piezoelectric ceramic component 100 has the configuration as described above. As described above, the first internal electrodes 102, the second internal electrodes 103, and the third internal electrodes 104 are formed in the piezoelectric ceramic body 101, the first internal electrodes 102 and the third internal electrodes 104 face each other via the piezoelectric ceramic body 101, and the second internal electrodes 103 and the third internal electrodes 104 face each other via the piezoelectric ceramic body 101. The first internal electrodes 102, the second internal electrodes 103, and the third internal electrodes 104 are insulated from one another.

The size of the multi-layer piezoelectric ceramic component 100 is not particularly limited, but assuming that the length (X-axis direction) is L and the width (Y-axis direction) is W, it is suitable that L/W is approximately 16 to 50. Further, it is suitable that the thickness (Z-axis direction) is approximately 0.5 mm to 1.5 mm. Further, a ratio of the length of the piezoelectric ceramic body 101 exposed from the second surface electrode 106 to the length of the piezoelectric ceramic body 101 exposed from the first surface electrode 105 is 1.7% or more and 50% or less. When the ratio becomes smaller than 1.7%, positioning accuracy for clamping the multi-layer piezoelectric ceramic component is reduced, which is not favorable. When the ratio becomes larger than 50%, the amount of displacement in the second end surface 101d is impaired, which is not favorable. As an example, the length of the piezoelectric ceramic body 101 exposed from the first surface electrode 105 in the X-axis direction is 2 mm, and the length of the piezoelectric ceramic body 101 exposed from the second surface electrode 106 in the X-axis direction is 5 mm.

Operation of Multi-Layer Piezoelectric Ceramic Component

In the multi-layer piezoelectric ceramic component 100, a voltage can be independently applied between the first internal electrodes 102 and the third internal electrodes 104 and between the second internal electrodes 103 and the third internal electrodes 104.

When a voltage is applied between the first internal electrodes 102 and the third internal electrodes 104, an inverse piezoelectric effect occurs in the piezoelectric ceramic body 101 between the first internal electrodes 102 and the third internal electrodes 104 and causes deformation (expansion and contraction) in the X-axis direction in the first region 101g. Further, when a voltage is applied between the second internal electrodes 103 and the third internal electrodes 104, an inverse piezoelectric effect occurs in the piezoelectric ceramic body 101 between the second internal electrodes 103 and the third internal electrodes 104 and causes deformation (expansion and contraction) in the X-axis direction in the second region 101h.

In such a manner, in the multi-layer piezoelectric ceramic component 100, the deformation in the first region 101g and the deformation in the second region 101h can be independently controlled. The first region 101g and the second region 101h are separately deformed in the X-axis direction, and thus the multi-layer piezoelectric ceramic component 100 can be deformed (bent) in the Z-axis direction.

Figure 12A:
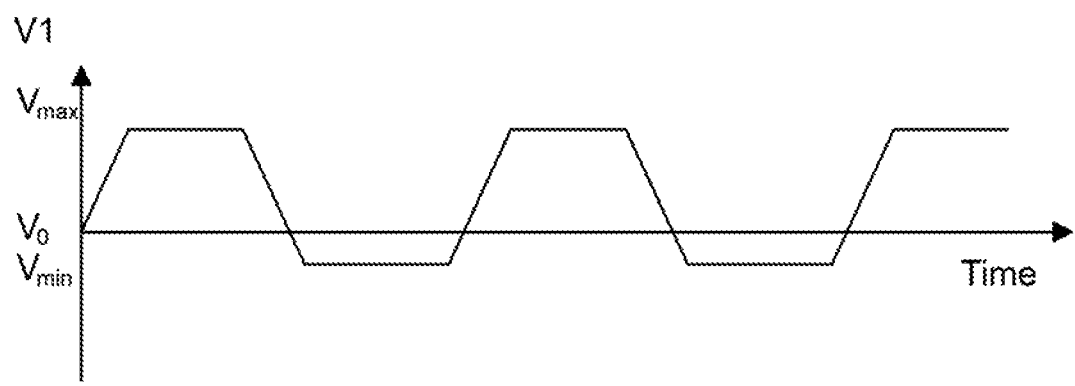
FIGS. 12A and 12B show examples of voltage waveforms applied to the multi-layer piezoelectric ceramic component 100.
Figure 12B:
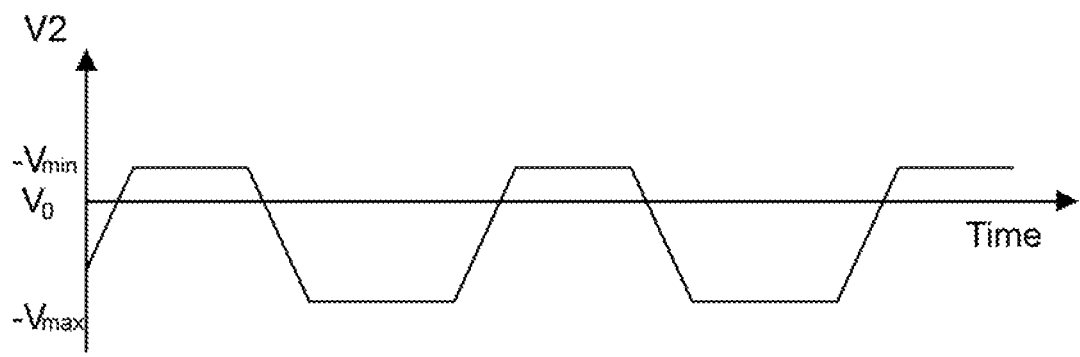

FIGS. 12A and 12B show examples of voltage waveforms applied to the multi-layer piezoelectric ceramic component 100. FIG. 12A shows a waveform of a voltage (V1) applied between the first internal electrodes 102 and the third internal electrodes 104. FIG. 12B shows a waveform of a voltage (V2) applied between the second internal electrodes 103 and the third internal electrodes 104. It should be noted that $V_O$ represents a potential of the third internal electrodes 104. As shown in FIGS. 12A and 12B, when the voltage V1 and the voltage V2 are set as reverse bias voltages in the same phase, one of the first region 101g and the second region 101h can be expanded, and the other one of the first region 101g and the second region 101h can be contracted.

It should be noted that when the thickness of the first region 101g and the thickness of the second region 101h have a ratio of 1:1, the first region 101g and the second region 101h are symmetrical with each other in terms of the amount of deformation, which is suitable. Further, the waveforms of the voltage V1 and the voltage V2 are not limited to those shown in FIGS. 12A and 12B and may be each a sine wave or a triangle wave.

Here, an operation when one end of the multi-layer piezoelectric ceramic component 100 is fixed with a fixing jig such as a clamp will be described.

Figure 13A:
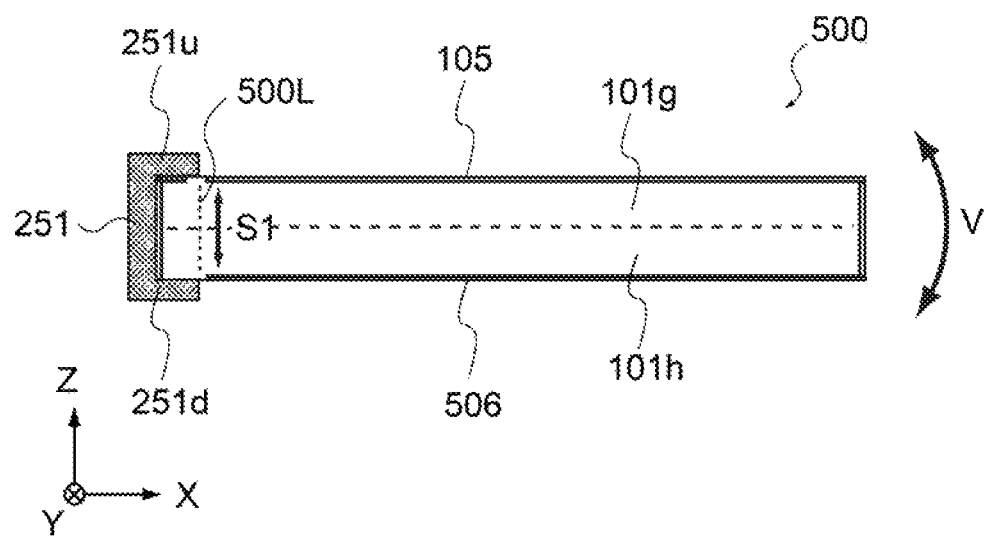
FIG. 13A shows an example in which a multi-layer piezoelectric ceramic component 500 according to a comparative example operates.

First, FIG. 13A shows an example in which a multi-layer piezoelectric ceramic component 500 according to a comparative example operates.

In the multi-layer piezoelectric ceramic component 500 according to the comparative example, the length of a second surface electrode 506 in the X-axis direction is the same as the length of the first surface electrode 105 in the X-axis direction. In such a configuration, a jig including an upper holding portion 251u and a lower holding portion 251d that have the same length is used as a fixing jig 251. This is because the use of the fixing jig 251 prevents the first surface electrode 105 and the second surface electrode 506 from being bitten by the fixing jig 251, the function of the piezoelectric ceramic body 101 is exerted over a wide area, and large vibration V is thus obtained in the multi-layer piezoelectric ceramic component 500.

However, when the fixing jig 251 keeps holding one end of the multi-layer piezoelectric ceramic component 500 while the multi-layer piezoelectric ceramic component 500 is being operated, the multi-layer piezoelectric ceramic component 500 vibrates with a line 500L as a reference, the line 500L connecting a tip end of the upper holding portion 251u and a tip end of the lower holding portion 251d. Thus, local stress S1 in the Z-axis direction occurs in the vicinity of the line 500L. This may generate a phenomenon such as a crush of the piezoelectric ceramic body 101 or a peel-off of the piezoelectric ceramic body 101 and each electrode in the vicinity of the fixing jig 251.

Figure 13B:
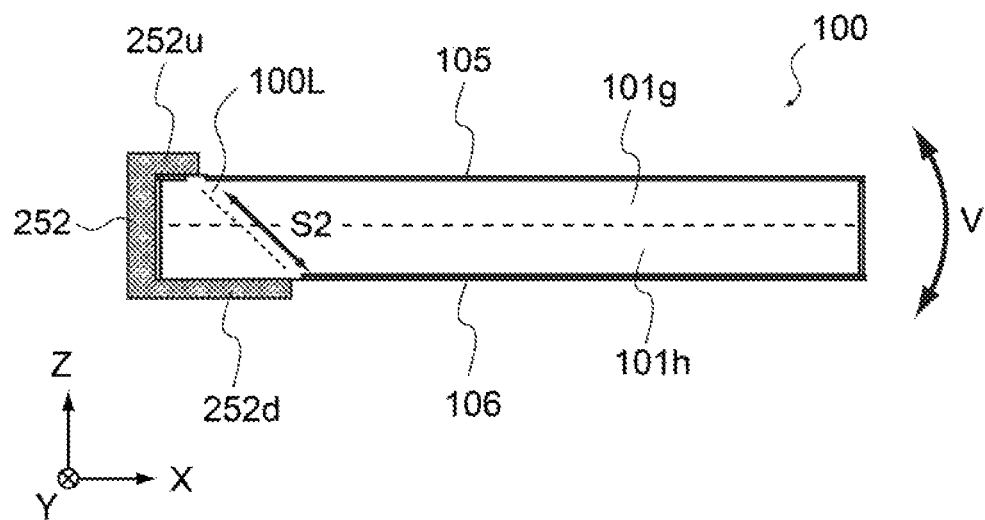
FIG. 13B shows an example in which the multi-layer piezoelectric ceramic component 100 according to the embodiment operates.

In contrast to the above comparative example, FIG. 13B shows an example in which the multi-layer piezoelectric ceramic component 100 according to the embodiment operates.

In the multi-layer piezoelectric ceramic component 100 according to the embodiment, the length of the second surface electrode 106 in the X-axis direction is configured to be shorter than the length of the first surface electrode 105 in the X-axis direction. With such a configuration, since the second surface electrode 106 becomes shorter, an inactive region in which displacement is suppressed increases as much. Additionally, with such a configuration, a fixing jig 252 including an upper holding portion 252u and a lower holding portion 252d whose length is larger than the length of the upper holding portion 252u can be used as a fixing jig with which the first surface electrode 105 and the second surface electrode 106 are not bitten.

Accordingly, in the multi-layer piezoelectric ceramic component 100 held by the fixing jig 252, displacement is forcibly suppressed by also the fixing jig 252, and internal stress mainly occurs along a line 100L connecting a tip end of the upper holding portion 252u and a tip end of the lower holding portion 252d (stress S2). As shown in FIG. 13B, the stress S2 includes many oblique components that are not parallel to the Z-axis direction, and as compared to the stress S1, the force is dispersed within the multi-layer piezoelectric ceramic component 100.

Accordingly, when the multi-layer piezoelectric ceramic component 100 is caused to operate, a load is less likely to be applied to the vicinity of the one end fixed with the fixing jig 252. For example, the crush of the piezoelectric ceramic body 101 or the peel-off of the piezoelectric ceramic body 101 and each electrode is suppressed. As a result, in the multi-layer piezoelectric ceramic component 100, the breakdown of the element is less likely to occur, and the reliability is improved.

Further, in the multi-layer piezoelectric ceramic component 100, the thickness of each layer of the piezoelectric ceramic body 101, the first internal electrodes 102, the second internal electrodes 103, and the third internal electrodes 104 can be set to be substantially the same, and thus a special forming method or green sheets having different layer thicknesses are unnecessary. This achieves the simplification of the process and the improvement in lead time and suppresses the increase in cost.

It should be noted that the length of the second surface electrode 106 may be configured to be larger than the length of the first surface electrode 105 in this embodiment. In this configuration, the fixing jig 252 can be used upside down from the state of FIG. 13B, so that a similar effect can be obtained.

Further, the fixing jig 252 may be made of an insulating material or may be made of metal. In particular, when the fixing jig 252 is made of metal, an insulating material (adhesive) or the like is interposed between the fixing jig 252 and the multi-layer piezoelectric ceramic component 100 such that the first end surface terminal electrode 107 and the second end surface terminal electrode 108 are not short-circuited.

Regarding Structure without Side Margin

As described above, the multi-layer piezoelectric ceramic component 100 has a structure in which the first internal electrodes 102, the second internal electrodes 103, and the third internal electrodes 104 are exposed at the first side surface 101a and the second side surface 101b.

Figure 14:
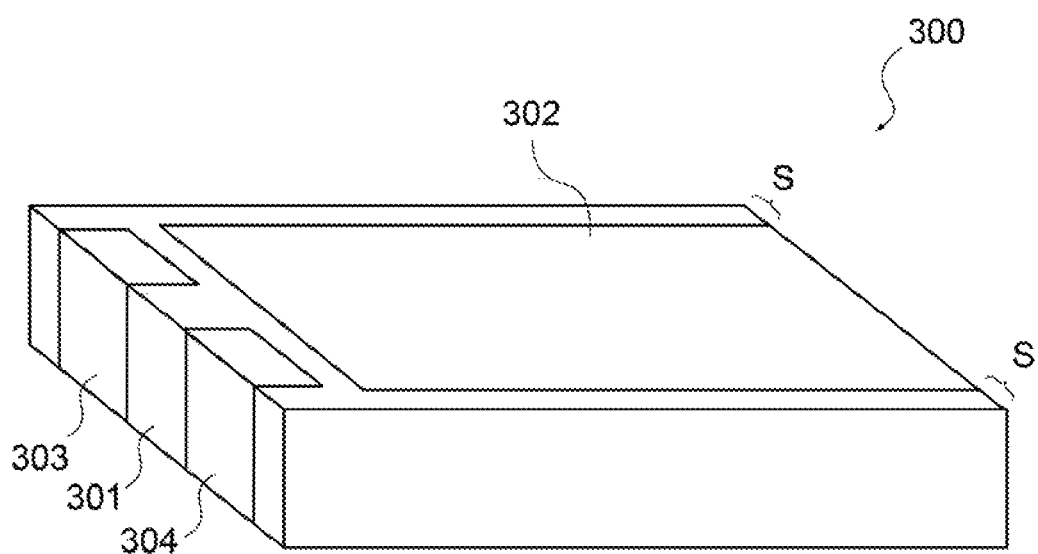
FIG. 14 is a perspective view of a multi-layer piezoelectric ceramic component 300 according to another comparative example.
Figure 14:
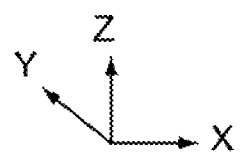

FIG. 14 is a perspective view of a multi-layer piezoelectric ceramic component 300 according to another comparative example.

As shown in FIG. 14, the multi-layer piezoelectric ceramic component 300 includes a piezoelectric ceramic body 301, a surface electrode 302, a first terminal electrode 303, and a second terminal electrode 304. Further, the multi-layer piezoelectric ceramic component 300 includes internal electrodes (not shown) corresponding to the first internal electrodes 102, the second internal electrodes 103, and the third internal electrodes 104.

In the multi-layer piezoelectric ceramic component 300, the internal electrodes are not exposed at the side surfaces and are embedded in the piezoelectric ceramic body 301. As shown in FIG. 14, side margins S made of a piezoelectric material are each provided on the side surface side of the internal electrodes.

The side margins S are not sandwiched by the internal electrodes in the Z-axis direction when the multi-layer piezoelectric ceramic component 300 is driven. Thus, the side margins S act as restraint portions that suppress the displacement of the multi-layer piezoelectric ceramic component 300. This reduces displacement performance of the multi-layer piezoelectric ceramic component 300.

To the contrary, in the multi-layer piezoelectric ceramic component 100, each width of the first internal electrodes 102, the second internal electrodes 103, and the third internal electrodes 104 is equal to a distance between the pair of side surfaces 101a and 101b. In other words, the first internal electrodes 102, the second internal electrodes 103, and the third internal electrodes 104 are exposed at the first side surface 101a and the second side surface 101b in the multi-layer piezoelectric ceramic component 100, and the multi-layer piezoelectric ceramic component 100 does not include side margins. Thus, it is possible to generate large displacement without receiving a restraint effect provided by the side margins and to prevent the displacement performance from being reduced.

Regarding Insulating Film

Figure 15:
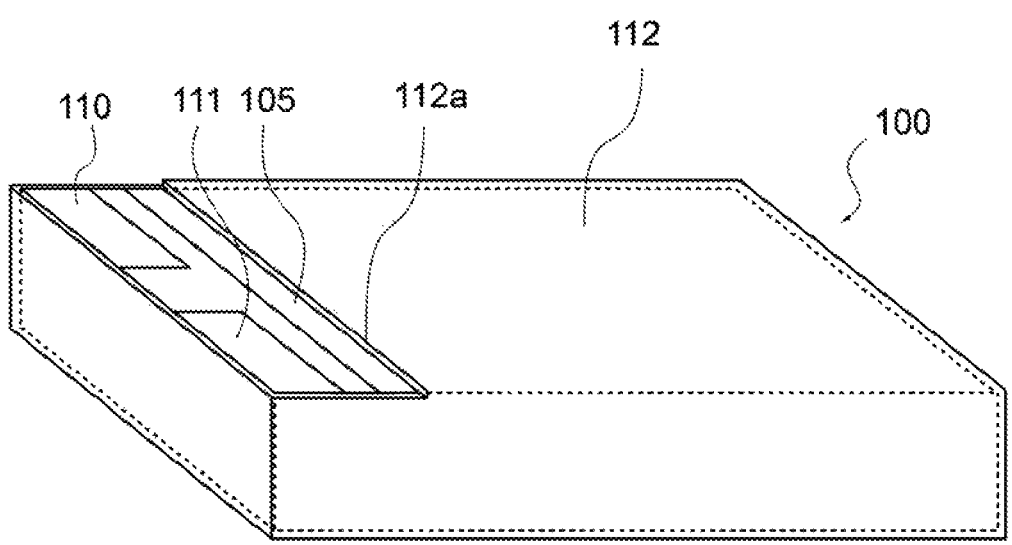
FIG. 15 is a perspective view of the multi-layer piezoelectric ceramic component 100 including an insulating film 112.
Figure 15:

The multi-layer piezoelectric ceramic component 100 may include an insulating film. FIG. 15 is a perspective view of the multi-layer piezoelectric ceramic component 100 including an insulating film 112.

As shown in FIG. 15, the insulating film 112 covers the outer periphery of the multi-layer piezoelectric ceramic component 100. Here, in the X-axis direction, the length of the insulating film 112 formed on the upper surface 101e is equal to the length of the second surface electrode 106. In other words, the insulating film 112 includes an opening 112a from which the first surface terminal electrode 110, the second surface terminal electrode 111, and the first surface electrode 105 are partially exposed. In the multi-layer piezoelectric ceramic component 100, electrical connection (three-terminal connection) to the first surface terminal electrode 110, the second surface terminal electrode 111, and the first surface electrode 105 via the single opening 112a can be established. This makes a wiring structure compact.

The range covered with the insulating film 112 is not limited to the range shown in FIG. 15 and only needs to cover at least the first side surface 101a and the second side surface 101b at which the first internal electrodes 102, the second internal electrodes 103, and the third internal electrodes 104 are exposed.

The material of the insulating film 112 is not particularly limited as long as the material is an insulating material. For example, an insulating resin such as a SiN or acrylic resin is suitable. It should be noted that the insulating film 112 is made of a material different from the material of the piezoelectric ceramic body 101, and a soft material can be used therefor. Thus, a restraint effect provided by the insulating film 112 can be made significantly small. In other words, in the multi-layer piezoelectric ceramic component 100, the displacement performance is prevented from being reduced.

Regarding Production Method

A production method for the multi-layer piezoelectric ceramic component 100 will be described.

Figure 16A:
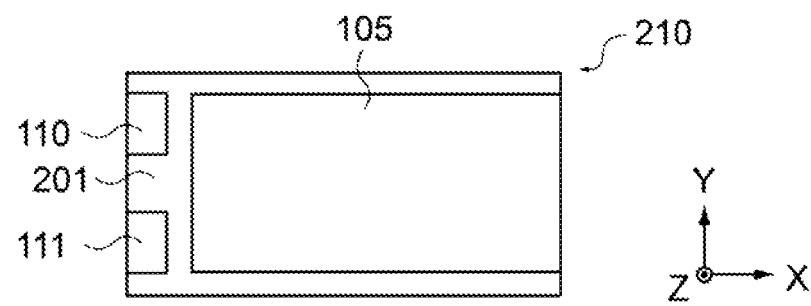
FIGS. 16A to 16E are each a schematic view of a sheet member.
Figure 16B:
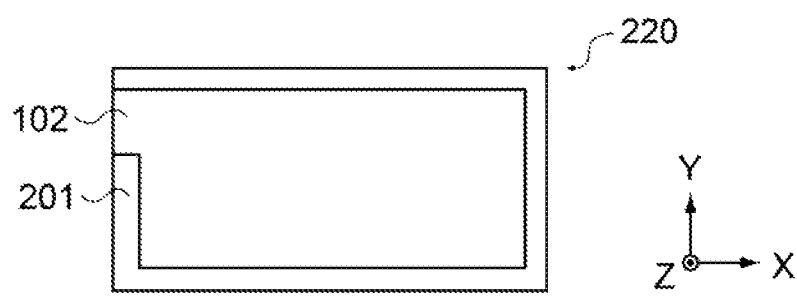

The multi-layer piezoelectric ceramic component 100 can be produced by laminating sheet members. FIGS. 16A to 16E are schematic views of respective sheet members. FIG. 16A shows a sheet member 210 including the first surface electrode 105, the first surface terminal electrode 110, the second surface terminal electrode 111, and a piezoelectric ceramic body 201. FIG. 16B shows a sheet member 220 including the first internal electrode 102 and the piezoelectric ceramic body 201.

Figure 16C:
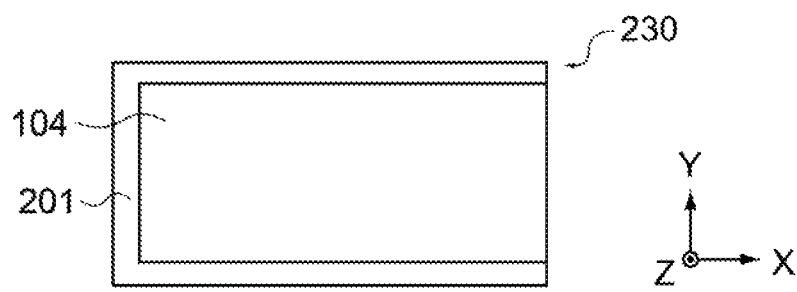
Figure 16D:
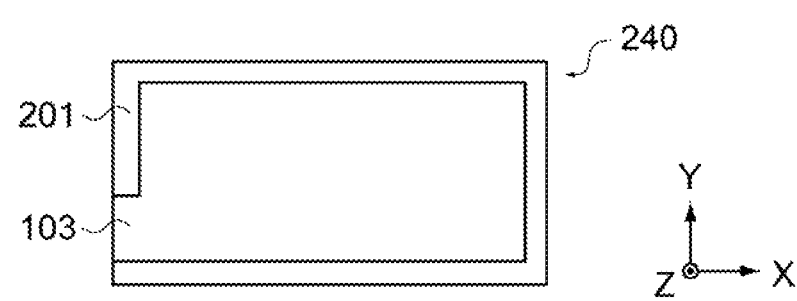
Figure 16E:
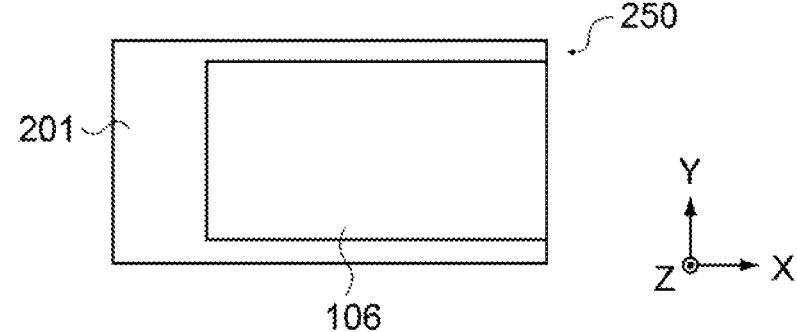

FIG. 16C shows a sheet member 230 including the third internal electrode 104 and the piezoelectric ceramic body 201. FIG. 16D shows a sheet member 240 including the second internal electrode 103 and the piezoelectric ceramic body 201. FIG. 16E shows a sheet member 250 including the second surface electrode 106 and the piezoelectric ceramic body 201.

First, a sheet member including only a piezoelectric ceramic body (hereinafter, referred to as piezoelectric sheet member) is laminated on the sheet member 250, and thereon, the sheet member 240, a piezoelectric sheet member, and the sheet member 230 are laminated in this order. Moreover, the sheet members 240 and the sheet members 230 are alternately laminated via piezoelectric sheet members.

Subsequently, the sheet members 220 and the sheet members 230 are alternately laminated via piezoelectric sheet members, and thereon, a piezoelectric sheet member and the sheet member 210 are laminated in this order. Subsequently, this laminate is pressure-bonded, and a binder is removed by heating or the like.

Subsequently, sintering is performed. At this stage, each internal electrode is embedded in the piezoelectric ceramic body 201, and side margins are formed. Subsequently, by heat treatment, the first end surface terminal electrode 107 and the second end surface terminal electrode 108 are formed on the first end surface 101c, and the third end surface terminal electrode 109 is formed on the second end surface 101d.

Subsequently, the side margins are cut and removed. Accordingly, the piezoelectric ceramic body 101 is formed from the piezoelectric ceramic bodies 201. The cutting of the side margins can be performed by dicing or laser irradiation. When the side margins are cut, the first side surface 101a and the second side surface 101b are formed, and the first internal electrodes 102, the second internal electrodes 103, and the third internal electrodes 104 are exposed at the first side surface 101a and the second side surface 101b (see FIG. 1).

Subsequently, the insulating film 112 including the opening 112a is formed (see FIG. 15). The insulating film 112 can be formed by a method such as mist deposition, sputtering, or dipping. Subsequently, the first surface terminal electrode 110 and the second surface terminal electrode 111 are electrically connected, and a DC voltage is applied. This causes a polarizing process and activates the piezoelectric ceramic body 101.

The multi-layer piezoelectric ceramic component 100 can be produced as described above. It should be noted that the production method for the multi-layer piezoelectric ceramic component 100 is not limited to the method described herein.

Regarding Piezoelectric Device

Figure 17:
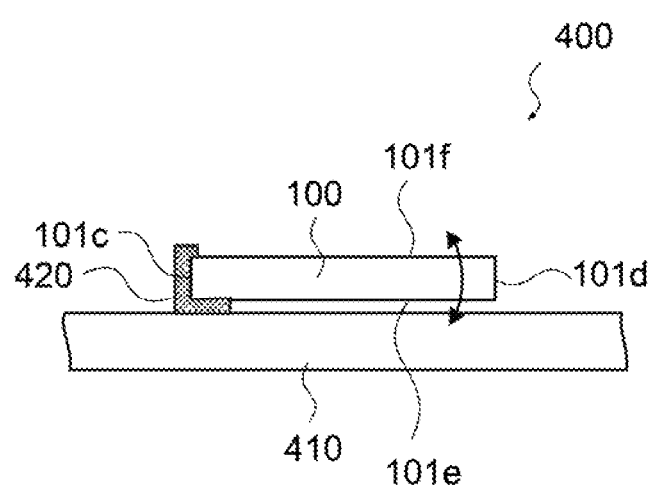
FIG. 17 is a schematic view of a piezoelectric device 400 including the multi-layer piezoelectric ceramic component 100.

The multi-layer piezoelectric ceramic component 100 can be mounted to a vibration member to configure a piezoelectric device. FIG. 17 is a schematic view of a piezoelectric device 400 including the multi-layer piezoelectric ceramic component 100. As shown in FIG. 17, the piezoelectric device 400 includes the multi-layer piezoelectric ceramic component 100, a vibration member 410, and a joint 420.

The vibration member 410 is a metal plate or a glass panel of a display and is not particularly limited. The joint 420 is made of a resin or the like and joins the multi-layer piezoelectric ceramic component 100 to the vibration member 410.

In the multi-layer piezoelectric ceramic component 100, a region of the upper surface 101e on the first end surface 101c side is joined to the joint 420. Wiring (not shown) is electrically connected to the first surface terminal electrode 110, the second surface terminal electrode 111, and the first surface electrode 105.

When a voltage is applied to each electrode, as described above, the multi-layer piezoelectric ceramic component 100 is deformed in the Z-axis direction (arrow in FIG. 17). This allows the vibration member 410 to vibrate. It should be noted that the method of mounting the multi-layer piezoelectric ceramic component 100 is not limited to that described herein. For example, the entire upper surface 101e may be joined to the joint 420.

Hereinabove, the embodiment of the present disclosure has been described, but the present disclosure is not limited to the embodiment described above and can be variously modified as a matter of course. Each embodiment is not limited to be an independent embodiment, and some embodiments can be combined as long as it is technically possible.

What is claimed is:

1. A multi-layer piezoelectric ceramic component, which is a bimorph piezoelectric actuator, comprising:
    a piezoelectric ceramic body
        having a cuboid shape in which a length is larger than a width and the width is larger than a thickness,
        having an upper surface and a lower surface facing each other in a thickness direction, a first end surface and a second end surface facing each other in a length direction, and a pair of side surfaces facing each other in a width direction, and
        including a first region on a side of the upper surface in the thickness direction and a second region on a side of the lower surface in the thickness direction;
    first internal electrodes that are formed in the first region and are drawn to the first end surface;
    second internal electrodes that are formed in the second region and are drawn to the first end surface;
    third internal electrodes that are formed in the first region and the second region and are drawn to the second end surface, the third internal electrodes being laminated alternately with the first internal electrodes in the first region at predetermined distances from the respective first internal electrodes in the thickness direction and being laminated alternately with the second internal electrodes in the second region at predetermined distances from the respective second internal electrodes in the thickness direction;
    a first end surface terminal electrode that is formed on the first end surface and is electrically connected to the first internal electrodes;
    a first surface terminal electrode that is formed on the upper surface and is electrically connected to the first end surface terminal electrode;
    a second end surface terminal electrode that is formed on the first end surface, is electrically insulated from the first end surface terminal electrode, and is electrically connected to the second internal electrodes;
    a second surface terminal electrode that is formed on the upper surface and is electrically connected to the second end surface terminal electrode;
    a third end surface terminal electrode that is formed on the second end surface and is electrically connected to the third internal electrodes;
    a first surface electrode that is formed on the upper surface, is electrically connected to the third end surface terminal electrode, and extends from the second end surface to face one of the first internal electrodes; and
    a second surface electrode that is formed on the lower surface, is electrically connected to the third end surface terminal electrode, extends from the second end surface to face one of the second internal electrodes, and has a length shorter than a length of the first surface electrode,
    wherein the pair of side surfaces, a part of the upper surface, and the lower surface are covered with an insulating film made of a material different from a material of the piezoelectric ceramic body, and
    the insulating film has a single opening on the upper surface through which the first surface terminal electrode, the second surface terminal electrode, and the first surface electrode (105) are partially exposed.

2. The multi-layer piezoelectric ceramic component according to claim 1, wherein
    the first internal electrodes, the second internal electrodes, and the third internal electrodes each have a width equal to a distance between the pair of side surfaces.

3. The multi-layer piezoelectric ceramic component according to claim 1, wherein
    the insulating film formed on the upper surface has a length equal to a length of the second surface electrode.

4. A piezoelectric device comprising:
    a vibration member;
    a fixing jig; and
    a multi-layer piezoelectric ceramic component, which is a bimorph piezoelectric actuator, mounted to the vibration member via the fixing jig,
    the multi-layer piezoelectric ceramic component comprising:
        a piezoelectric ceramic body
            having a cuboid shape in which a length is larger than a width and the width is larger than a thickness,
            having an upper surface and a lower surface facing each other in a thickness direction, a first end surface and a second end surface facing each other in a length direction, and a pair of side surfaces facing each other in a width direction, and
            including a first region on a side of the upper surface in the thickness direction and a second region on a side of the lower surface in the thickness direction,
        first internal electrodes that are formed in the first region and are drawn to the first end surface;
        second internal electrodes that are formed in the second region and are drawn to the first end surface;
        third internal electrodes that are formed in the first region and the second region and are drawn to the second end surface, the third internal electrodes being laminated alternately with the first internal electrodes in the first region at predetermined distances from the respective first internal electrodes in the thickness direction and being laminated alternately with the second internal electrodes in the second region at predetermined distances from the respective second internal electrodes in the thickness direction;
        a first end surface terminal electrode that is formed on the first end surface and is electrically connected to the first internal electrodes;
        a first surface terminal electrode that is formed on the upper surface and is electrically connected to the first end surface terminal electrode;
        a second end surface terminal electrode that is formed on the first end surface, is electrically insulated from the first end surface terminal electrode, and is electrically connected to the second internal electrodes;

a second surface terminal electrode that is formed on the upper surface and is electrically connected to the second end surface terminal electrode;

a third end surface terminal electrode that is formed on the second end surface and is electrically connected to the third internal electrodes;

a first surface electrode that is formed on the upper surface, is electrically connected to the third end surface terminal electrode, and extends from the second end surface to face one of the first internal electrodes; and a second surface electrode that is formed on the lower surface, is electrically connected to the third end surface terminal electrode, extends from the second end surface to face one of the second internal electrodes, and has a length shorter than a length of the first surface electrode, wherein the pair of side surfaces, a part of the upper surface, and the lower surface are covered with an insulating film made of a material different from a material of the piezoelectric ceramic body, the insulating film has a single opening on the upper surface from which the first surface terminal electrode, the second surface terminal electrode, and the first surface electrode are partially exposed, and the region of the upper surface on the first end surface side including the opening is joined to the fixing jig.

* * * * *